(12) United States Patent
Kim et al.

(10) Patent No.: US 7,544,991 B2
(45) Date of Patent: Jun. 9, 2009

(54) NON-VOLATILE MEMORY DEVICE AND METHODS OF MANUFACTURING AND OPERATING THE SAME

(75) Inventors: Jin-Woo Kim, Suwon-si (KR); Jong-Hyon Ahn, Suwon-si (KR); Don-Woo Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 139 days.

(21) Appl. No.: 11/698,067

(22) Filed: Jan. 26, 2007

(65) Prior Publication Data

US 2008/0093649 A1    Apr. 24, 2008

(30) Foreign Application Priority Data

Oct. 23, 2006    (KR)  ............... 10-2006-0103065

(51) Int. Cl.
*H01L 29/788* (2006.01)
*H01L 21/336* (2006.01)
(52) U.S. Cl. .................. 257/316; 257/321; 438/259; 438/264
(58) Field of Classification Search .......... 257/316, 257/321; 438/259, 264
See application file for complete search history.

(56) References Cited

U.S. PATENT DOCUMENTS

| | | | |
|---|---|---|---|
| 5,029,130 A | 7/1991 | Yeh | |
| 5,045,488 A | 9/1991 | Yeh | |
| 5,338,953 A * | 8/1994 | Wake | 257/316 |
| 5,869,369 A | 2/1999 | Hong | |
| 6,693,010 B1 | 2/2004 | Mirgorodski | |
| 6,888,193 B2 * | 5/2005 | Huang | 257/317 |

FOREIGN PATENT DOCUMENTS

| | | |
|---|---|---|
| JP | 07-169865 | 7/1995 |
| JP | 10-107166 | 4/1998 |

\* cited by examiner

*Primary Examiner*—Mark Prenty
(74) *Attorney, Agent, or Firm*—Harness, Dickey & Pierce, P.L.C.

(57) ABSTRACT

A non-volatile memory device and methods of manufacturing and operating the same are provided. In a method of manufacturing a non-volatile memory device, a substrate having a stepped portion that may include a first horizontal face, a second horizontal face lower than the first horizontal face, and a vertical face connected between the first and second horizontal faces may be prepared. A first impurity region may be formed under the first horizontal face. A tunnel insulation layer may be continuously formed on the vertical face and the second horizontal face. A floating gate electrode having a tip higher than the first horizontal face may be formed on the tunnel insulation layer. A dielectric layer may be formed on the floating gate electrode. The floating gate electrode may be covered with a control gate electrode. A second impurity region horizontally spaced apart from the floating gate electrode may be formed under the second horizontal face.

11 Claims, 8 Drawing Sheets

NON-VOLATILE MEMORY DEVICE AND METHODS OF MANUFACTURING AND OPERATING THE SAME

PRIORITY STATEMENT

This application claims priority under 35 USC § 119 to Korean Patent Application No. 2006-103065 filed on Oct. 23, 2006, in the Korean Intellectual Property Office (KIPO), the entire contents of which are herein incorporated by reference.

BACKGROUND

1. Field

Example embodiments relate to a non-volatile memory device and methods of manufacturing and operating the non-volatile memory device. Other example embodiments relate to a non-volatile memory device including a split gate and methods of manufacturing and operating the non-volatile memory device.

2. Description of the Related Art

Generally, a semiconductor memory device is classified into a volatile memory device, e.g., a dynamic random access memory (DRAM) and/or a static random access memory (SRAM), which loses data over time, and a non-volatile memory device, e.g., a read only memory (ROM), that continuously stores data regardless of passage of time. The volatile memory device may rapidly input/output data. In contrast, the non-volatile memory device may slowly input/output data.

An electrically erasable programmable read only memory (EEPROM) device or a flash memory device capable of inputting/outputting data in the non-volatile memory device has been widely used. The flash memory device may electrically control an input/output of data using Fowler-Nordheim (F-N) tunneling or channel hot electron injection. A stacked gate type non-volatile memory device may have a gate structure that may include a tunnel insulation layer, a floating gate electrode, a dielectric layer and a control gate electrode sequentially stacked on a semiconductor substrate, e.g., a silicon wafer.

A split gate type non-volatile memory device may have a split gate structure that may include a gate insulation layer formed on a semiconductor substrate, a floating gate electrode formed on the gate insulation layer, an oxide layer pattern formed on the floating gate electrode, a tunnel oxide layer formed on a sidewall of the floating gate electrode, and a control gate electrode formed on the tunnel oxide layer. FIG. 1 is a cross-sectional view illustrating a conventional split gate type non-volatile memory device. Referring to FIG. 1, a gate insulation layer 106 may be formed on a semiconductor substrate 100 having source/drain regions 102 and 104. A floating gate electrode 108 may be formed on the gate insulation layer 106. A concave recess may be formed on a surface portion of the floating gate electrode 108. A dielectric layer 112 surrounds a sidewall of the floating gate electrode. Further, a control gate electrode 114 is formed on the dielectric layer 112.

An oxide layer pattern 110 may be formed in the concave recess. The floating gate electrode 108 may have both tips making contact with the oxide layer pattern 110. Electrons may pass through the tips by F-N tunneling to perform a programming operation and/or an erasing operation. An integration degree of the non-volatile memory device has improved. Because the conventional split gate type non-volatile memory device is relatively large, there exists a limit to improve the integration degree of the split gate type non-volatile memory device.

SUMMARY

Example embodiments provide a non-volatile memory device having an improved integration degree. Example embodiments also provide methods of manufacturing and operating the above-mentioned non-volatile memory device.

A non-volatile memory device in accordance with example embodiments may include a substrate having a stepped portion that may include a first horizontal face, a second horizontal face lower than the first horizontal face, and a vertical face connected between the first and second horizontal faces, a first impurity region formed under the first horizontal face, a floating gate electrode formed on the vertical face and the second horizontal face and having a tip higher than the first horizontal face, a tunnel insulation layer formed between the stepped portion and the floating gate electrode, a control gate electrode covering the floating gate electrode, a dielectric layer formed between the floating gate electrode and the control gate electrode, and a second impurity region formed under the second horizontal face and horizontally spaced apart from the floating gate electrode.

According to example embodiments, the control gate electrode may be partially formed on the second impurity region. The dielectric layer may include silicon oxide and/or silicon oxynitride. The floating gate electrode may have a sectored cross section.

In a method of manufacturing a non-volatile memory device in accordance with example embodiments, a substrate having a stepped portion that may include a first horizontal face, a second horizontal face lower than the first horizontal face, and a vertical face connected between the first and second horizontal faces may be prepared. A first impurity region may be formed under the first horizontal face. A tunnel insulation layer may be continuously formed on the vertical face and the second horizontal face. A floating gate electrode having a tip higher than the first horizontal face may be formed on the tunnel insulation layer. A dielectric layer may be formed on the floating gate electrode. The floating gate electrode may be covered with a control gate electrode. A second impurity region horizontally spaced apart from the floating gate electrode may be formed under the second horizontal face.

According to example embodiments, the stepped portion may be formed by forming a mask pattern that partially exposes the substrate, and by etching the substrate using the mask pattern as an etching mask to form a trench. The first impurity region may be formed by forming a first preliminary impurity region in a surface of the substrate, and by etching the substrate. The mask pattern may include nitride. An oxide layer may be additionally formed on the substrate to reduce stresses between the mask pattern and the substrate. The floating gate electrode may be formed by forming a conductive layer on the mask pattern and the trench, isotropically etching the conductive layer, and removing the mask pattern. A preliminary tunnel insulation layer may be further formed on the mask pattern and the trench. The second impurity region may be formed by doping a bottom face of the trench that may be exposed through the control gate electrode with impurities, and diffusing the impurities into the substrate under a lower portion of the control gate electrode.

According to example embodiments, a method of operating a non-volatile memory device may include maintaining a channel region between first and second impurity regions in an on state, applying a threshold voltage to a control gate electrode and applying a positive voltage to the first impurity region and grounding the second impurity region.

The method may further include applying a positive voltage to the control gate electrode, wherein the positive voltage is an erase voltage and the first and second impurity regions are grounded. Applying the threshold voltage may include applying a read voltage, and wherein the first and second impurity regions are grounded. A channel region under a floating gate electrode may be maintained in an on state and a channel region under the control gate electrode may be maintained in an off state.

According to example embodiments, the split gate type non-volatile memory device may be formed in the trench so that the non-volatile memory device may have an improved integration degree. The dielectric layer and the control gate electrode may cover the tips of the floating gate electrode so that an erasing operation of the non-volatile memory device may be carried out using a relatively low voltage.

BRIEF DESCRIPTION OF THE DRAWINGS

Example embodiments will be more clearly understood from the following detailed description taken in conjunction with the accompanying drawings.

FIG. 1 is a cross-sectional view illustrating a conventional non-volatile memory device;

FIG. 2 is a cross-sectional view illustrating a non-volatile memory device in accordance with example embodiments;

FIGS. 3 to 13 are cross-sectional views illustrating a method of manufacturing the non-volatile memory device in FIG. 2;

FIG. 14 is a cross-sectional view illustrating a programming operation of the non-volatile memory device in FIG. 2;

FIG. 15 is a cross-sectional view illustrating an erasing operation of the non-volatile memory device in FIG. 2; and FIG. 16 is a cross-sectional view illustrating a reading operation of the non-volatile memory device in FIG. 2.

DETAILED DESCRIPTION OF EXAMPLE EMBODIMENTS

Figure 1:
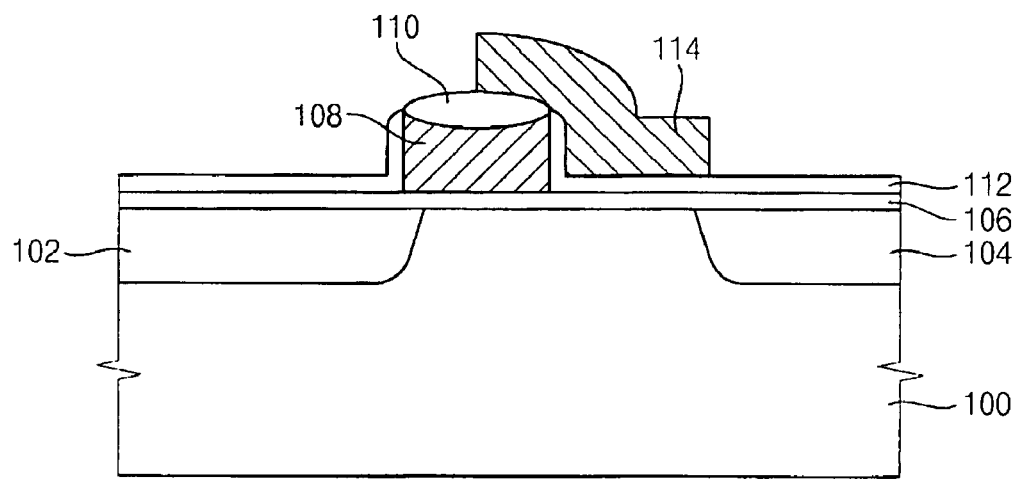
FIGS. 1-16 represent non-limiting, example embodiments as described herein.

Example embodiments are described more fully hereinafter with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to: as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
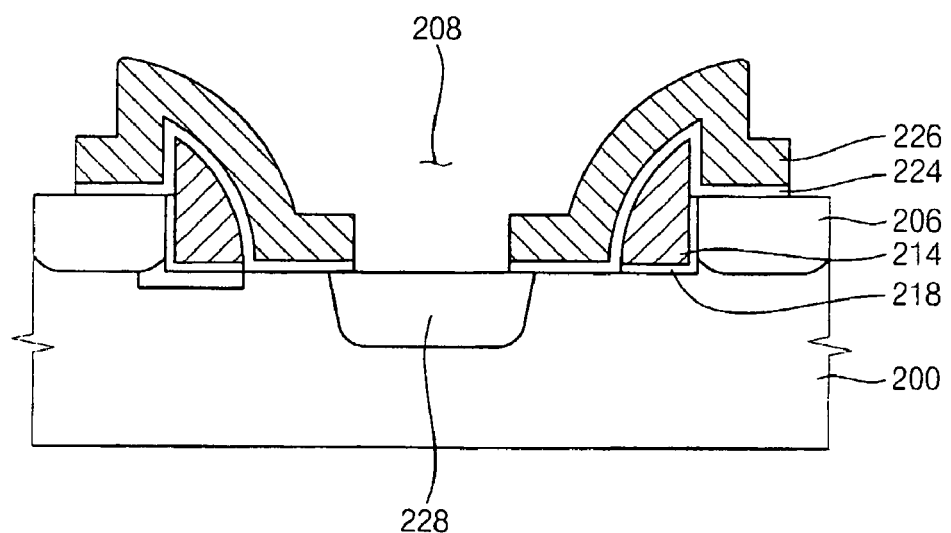

FIG. 2 is a cross-sectional view illustrating a non-volatile memory device in accordance with example embodiments. Referring to FIG. 2, a non-volatile memory device in accordance with example embodiments may include a trench 208, a first impurity region 206, a second impurity region 228, a tunnel insulation layer pattern 218, a floating gate electrode 214, a dielectric layer pattern 224 and a control gate electrode 226.

The trench 208 may be formed at a surface portion of a single crystalline semiconductor substrate 200, e.g., a silicon wafer. The trench 208 defines a stepped portion of the semiconductor substrate 200. The stepped portion of the semiconductor substrate 200 may have a first horizontal face, a second horizontal face lower than the first horizontal face, and a vertical face between the first and second horizontal faces. The first impurity region 206 may be formed under the first horizontal face. The first impurity region 206 may function as a source region of the non-volatile memory device. The first impurity region 206 may be doped with N type impurities, e.g., phosphorous and/or arsenic.

The floating gate electrode 214 may be formed on the vertical face and the second horizontal face. As shown in FIG. 2, the floating gate electrode 214 may have a sectored cross section so that the floating gate electrode 214 may have an upper tip and a lower tip. The upper tip may be positioned higher than the first horizontal face. The upper tip may be covered with the dielectric layer pattern 224 and the control gate electrode 226. The upper tip may serve as a passageway through which electrons in the floating gate electrode 214 pass into the control gate electrode 226 during an erasing operation of the non-volatile memory device. Because the upper tip is covered with the control gate electrode 226, the erasing operation of the non-volatile memory device may be carried out using a relatively low voltage.

The lower tip may be arranged on the second horizontal face. The lower tip may serve as a passageway through which electrons in the second impurity region 228 pass into the floating gate electrode 214 during a programming operation of the non-volatile memory device. The floating gate electrode 214 may include polysilicon doped with impurities. The tunnel insulation layer 210 may be formed between the stepped portion of the semiconductor substrate 200 and the floating gate electrode 214. The tunnel insulation layer 210 may include oxide and/or silicon oxide.

The control gate electrode 226 may cover the floating gate electrode 214. The control gate electrode 226 may cover the upper tip of the floating gate electrode 214. A first end of the control gate electrode 226 may be placed over the first impurity region 206. A second end of the control gate electrode 226 opposite to the first end may be positioned over the second impurity region 228. The control gate electrode 226 may include a polysilicon layer doped with impurities, a metal silicide layer and/or a stacked structure thereof.

The dielectric layer pattern 224 may be interposed or inserted between the floating gate electrode 214 and the control gate electrode 226. Because the control gate electrode 226 covers the floating gate electrode 214, the dielectric layer pattern 224 may have an increased capacitance. To reduce the capacitance of the dielectric layer pattern 224, the dielectric layer pattern 224 may include a material having a low dielectric constant, e.g., silicon oxide and/or silicon oxynitride.

The second impurity region 228 may be spaced apart from the floating gate electrode 214 along a horizontal direction. The second impurity region 228 may be formed under the second horizontal face. The second impurity region 228 may partially overlap the control gate electrode 226. The second impurity region 228 may include a material substantially the same as that of the first impurity region 206. Alternatively, the second impurity region 228 may include a material different from that of the first impurity region 206. A channel region may be formed between the first impurity region 206 and the second impurity region 228. The channel region may be turned-on or turned-off. The turn-on or the turn-off of the channel region may be partially generated.

Figure 3:
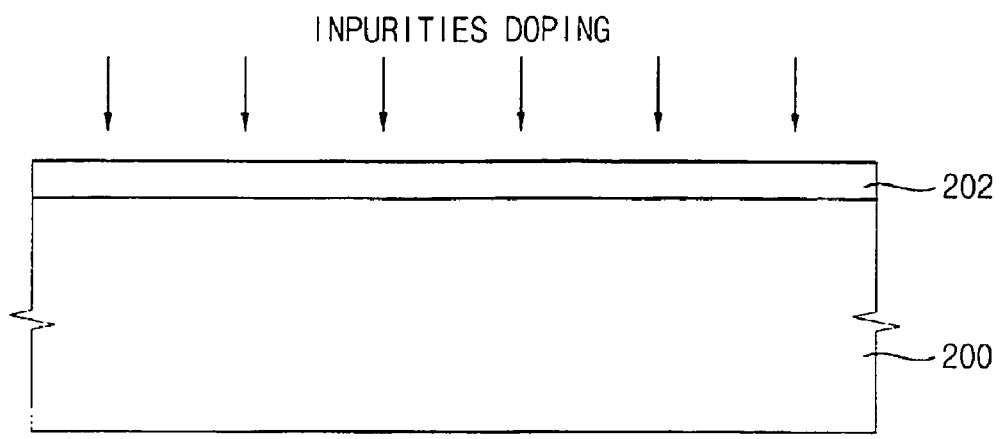

Hereinafter, a method of manufacturing the non-volatile memory device in FIG. 2 is illustrated in detail. FIGS. 3 to 13 are cross-sectional views illustrating a method of manufacturing the non-volatile memory device in FIG. 2. Referring to FIG. 3, a surface portion of the semiconductor substrate 200, e.g., a silicon wafer, may be doped with impurities to form a first preliminary impurity region 202.

The doping process may include a diffusion process and/or an ion implantation process. According to the diffusion process, an oxide layer including the impurities may be formed on the semiconductor substrate 200. The impurities may be separated from the oxide layer, and oxygen in the oxide layer may be simultaneously reacted with silicon in the semiconductor substrate 200 to form a cap oxide layer. The cap oxide layer may prevent or reduce the impurities from being discharged. The impurities may diffuse into the semiconductor substrate 200 using thermal energy to form the first preliminary impurity region 202.

According to the ion implantation process, atoms in the impurities may be ionized and then accelerated to provide the atoms in the impurities with a relatively high kinetic energy. The atoms in the impurities having the relatively high kinetic energy may be forcibly injected into the semiconductor substrate 200 to form the first preliminary impurity region 202. In doping the semiconductor substrate 200 with the impurities using any one of the doping process and the ion implantation process, the impurities may include N type impurities, e.g., phosphorous (P) and/or arsenic (As).

Figure 4:
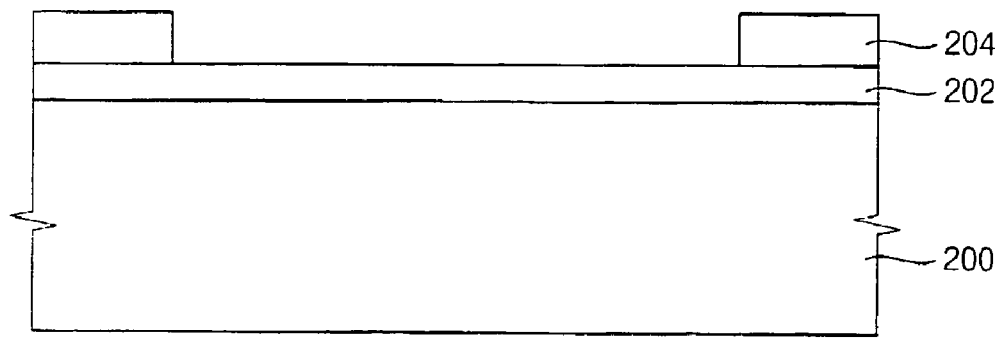

Referring to FIG. 4, a mask pattern 204, which partially exposes the semiconductor substrate 200, may be formed on the semiconductor substrate 200 having the first preliminary impurity region 202. The mask pattern 204 may include nitride and/or silicon nitride. Stresses may be applied to silicon in the semiconductor substrate 200 due to the nitride in the mask pattern 204. Therefore, although not illustrated in detail, an oxide layer may be further formed on the semiconductor substrate 200 to reduce the stresses.

Figure 5:
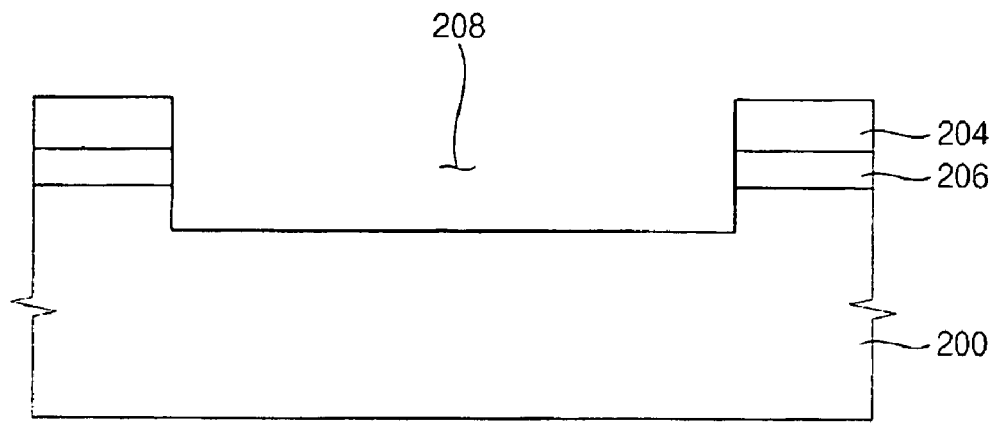

Referring to FIG. 5, the semiconductor substrate 200 may be etched using the mask pattern 204 as an etching mask to form a trench 208. The etching process may include an anisotropic etching process, e.g., a plasma etching process. The formation of the trench 208 may bring about the stepped portion of the semiconductor substrate 200. The stepped portion may have the first horizontal face, the second horizontal face lower than the first horizontal face, and the vertical face connected between the first and second horizontal faces.

The first impurity region 206 may be formed on the first horizontal face. The first impurity region 206 may be formed by etching the first preliminary impurity region 202. The first impurity region 206 may serve as a source region of the non-volatile memory device. The mask pattern 204 may still remain over the first horizontal face on which the first impurity region 206 is formed. The mask pattern 204 may be placed on the first impurity region 206. Although not illustrated in the figures, after forming the trench 208, a thermal oxide layer may be formed on inner faces of the trench 208. The thermal oxide layer may cure damages in the semiconductor substrate 200 generated in the plasma etching process. The thermal oxide layer may be formed by thermally oxidizing the inner faces of the trench 208. Therefore, the thermal oxide layer may be relatively thin.

Figure 6:
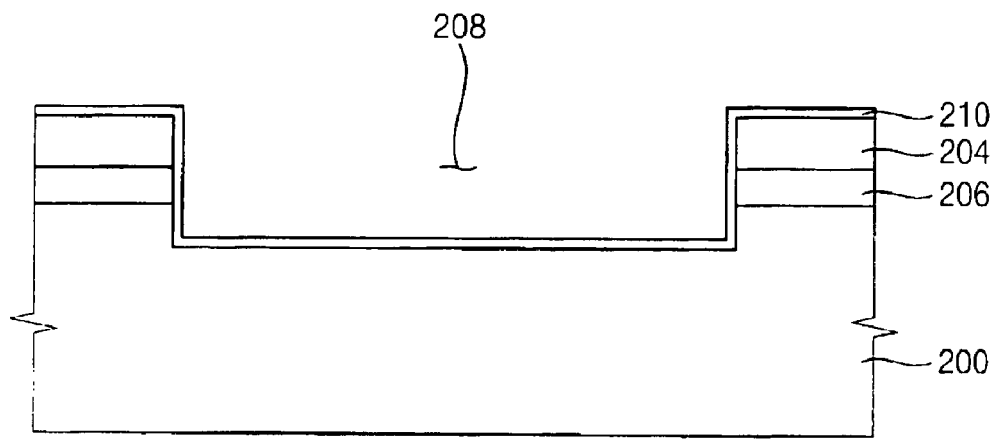
Figure 7:
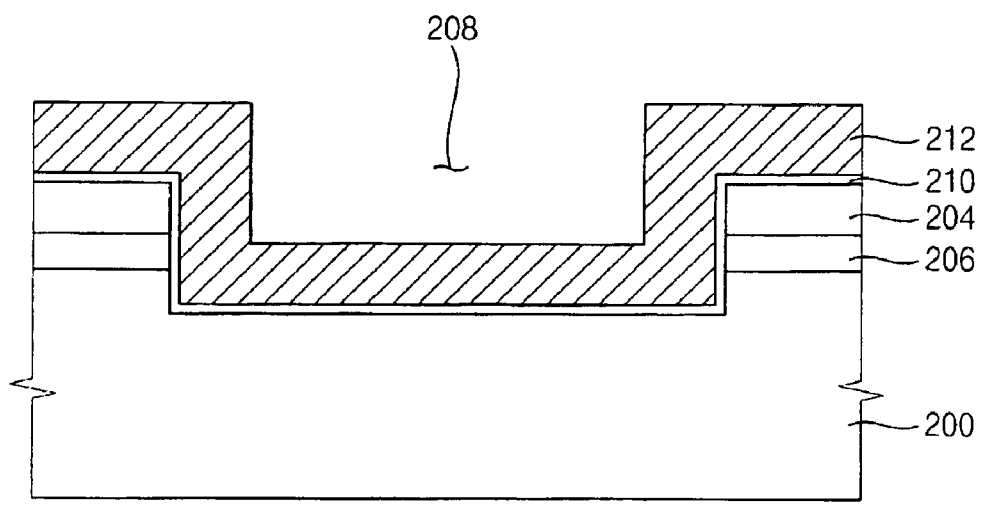

Referring to FIG. 6, the tunnel insulation layer 210 may be formed on the mask pattern 204 and the inner faces of the trench 208. The tunnel insulation layer 210 may include a silicon oxide layer. The silicon oxide layer may be formed by a thermal oxidation process and/or a chemical vapor deposition (CVD) process, to provide the relatively thin silicon oxide layer. In example embodiments, a method of forming the tunnel insulation layer 210 or a thickness of the tunnel insulation layer 210 may be not restricted. Referring to FIG. 7, a first conductive layer 212 for the floating gate electrode may be formed on the tunnel insulation layer 210. The first conductive layer 210 may be continuously formed on the tunnel insulation layer 210 along profiles of the mask pattern 204 and the trench 208. The trench 208 may not be fully filled with the first conductive layer 212. The first conductive layer 212 may include a polysilicon layer, for example, a polysilicon layer doped with impurities. The impurities may include N type impurities, e.g., phosphorous (P) and/or arsenic (As).

Figure 8:
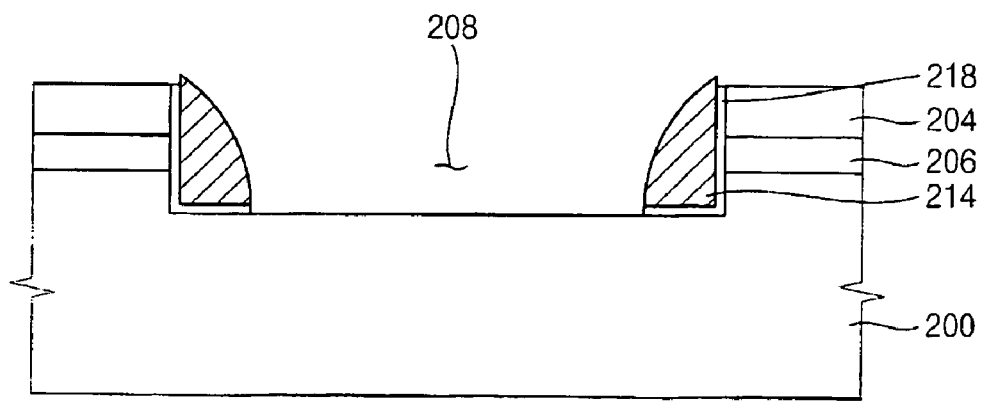

Referring to FIG. 8, the tunnel insulation layer 210 and the first conductive layer 212 may be anisotropically etched to form the tunnel insulation layer pattern 218 and the floating gate electrode 214 on a sidewall of the mask pattern 204 and the vertical face of the semiconductor substrate 200. When the first conductive layer 212 is anisotropically etched, a portion of the first conductive layer 212 on the sidewall of the mask pattern 204 and the vertical face of the semiconductor substrate 200 may not be etched at all while the rest of the portion of the first conductive layer 212 on the mask pattern and the bottom face of the trench 208 may be etched.

Accordingly, the floating gate electrode 214 having the sectored cross section may be formed on the sidewall of the mask pattern 204 and the vertical face of the semiconductor substrate 200. The floating gate electrode 214 may have the upper tip adjacent to the sidewall of the mask pattern 240, and the lower tip adjacent to the second horizontal face. The upper and lower tips may serve as passageways through which electrons pass.

Figure 9:
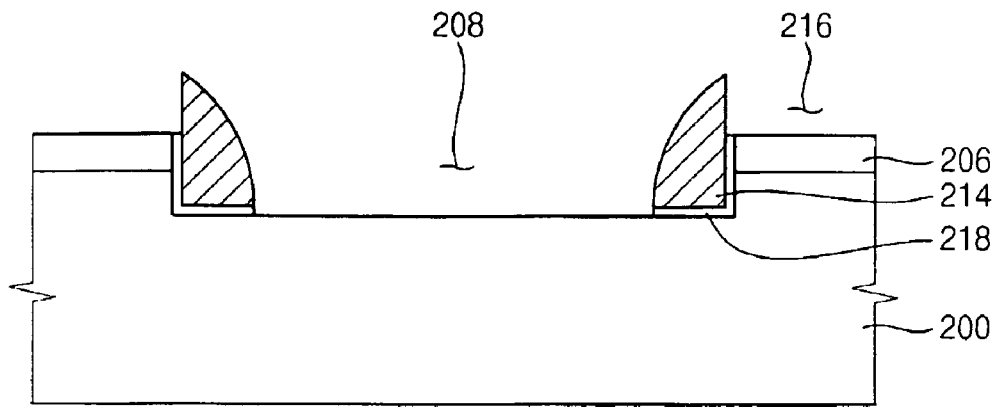

Referring to FIG. 9, the mask pattern 204 may then be removed to expose the first horizontal face. After removing the mask pattern 204, a hole 216 may be formed over the first horizontal face. The upper tip of the floating gate electrode 214 may be simultaneously exposed. The upper tip of the floating gate electrode 214 may be positioned higher than the first horizontal face. When a dielectric layer 220 is formed on a profile of the floating gate electrode 214, an effective area of the floating gate electrode 214, which makes contact with the dielectric layer 220, may be enlarged because the upper tip of the floating gate electrode 214 may be exposed.

Figure 10:
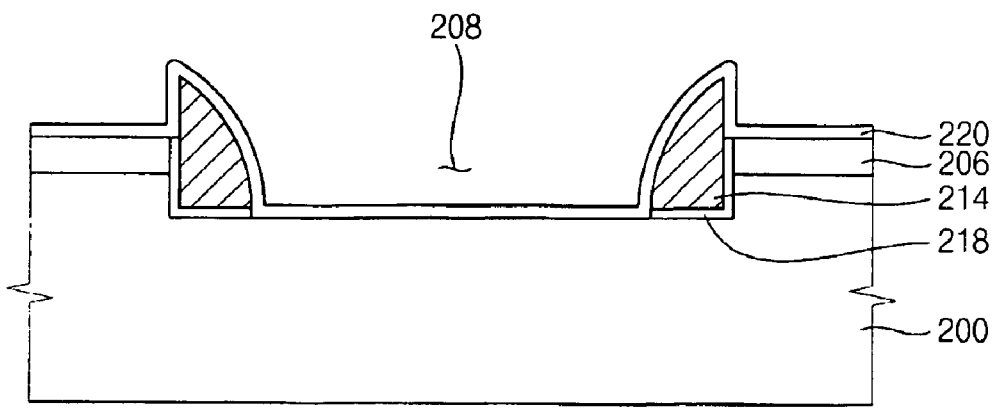

Referring to FIG. 10, the dielectric layer 220 may be continuously formed on the first horizontal face, the floating gate electrode 214 and the second horizontal face. As described above, the effective area between the floating gate electrode 214 and the dielectric layer 220 may be enlarged. The increased effective area between the floating gate electrode 214 and the dielectric layer 220 may provide the control gate electrode 226 and the floating gate electrode 214 with an increased capacitance. To reduce the capacitance of the floating gate electrode 214 and the control gate electrode 226, the dielectric layer 220 may include a material having a low dielectric constant, e.g., silicon oxide and/or silicon oxynitride.

Figure 11:
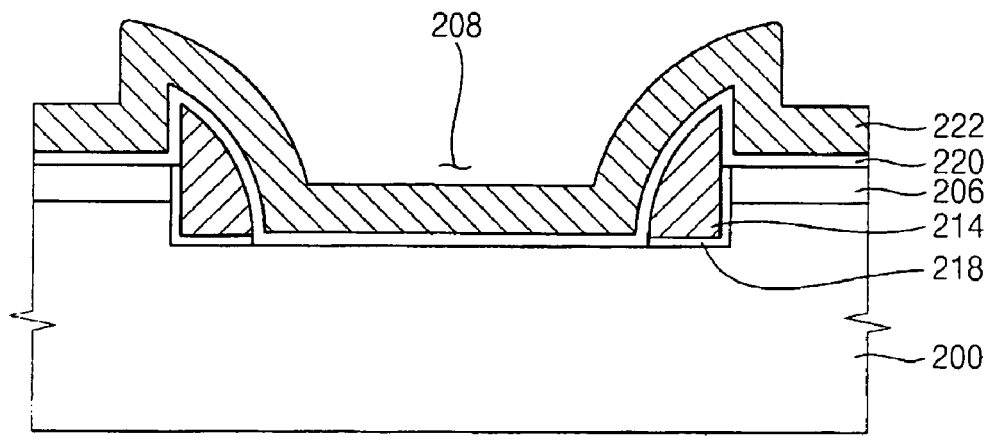
Figure 12:
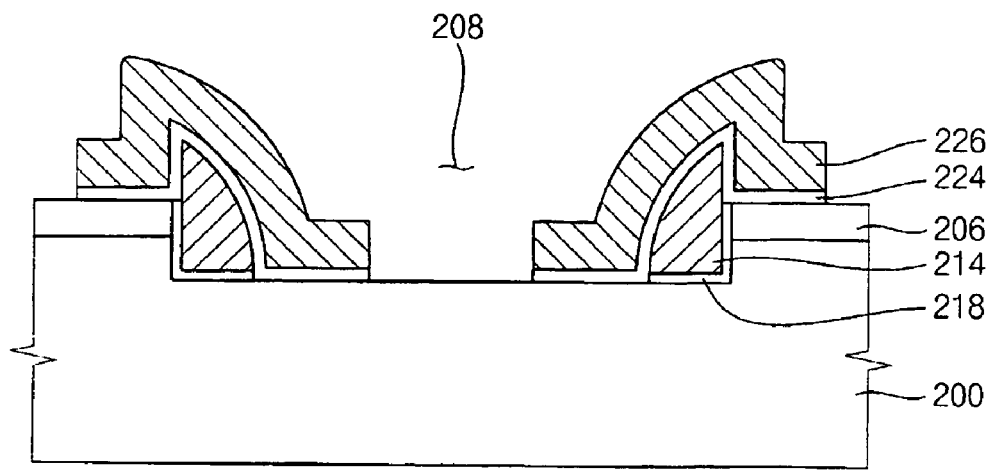

Referring to FIG. 11, a second conductive layer 222 for the control gate electrode may be formed on the dielectric layer 220. The second conductive layer 222 may include a polysilicon layer doped with impurities, a metal silicide layer and/or a stacked structure thereof. The impurities may be substantially the same as those in the first conductive layer 212. The impurities may include N type impurities, e.g., phosphorous (P) and/or arsenic (As). Referring to FIG. 12, the second conductive layer 222 and the dielectric layer 220 may be patterned to form the dielectric layer pattern 224 and the control gate electrode 226 covering the floating gate electrode 214. A second mask pattern (not shown), which partially exposes the second conductive layer 222, may be formed on the second conductive layer 222. The second conductive layer 222 and the dielectric layer 220 may be etched using the second mask pattern as an etching mask to form the dielectric layer pattern 224 and the control gate electrode 226.

The control gate electrode 226 may fully cover the upper tip of the floating gate electrode 214. As mentioned above, the upper tip of the floating gate electrode 214 may be used as the passageway through which the electrons pass during the erasing operation of the non-volatile memory device. Because the upper tip is covered with the control gate electrode 226, the erasing operation of the non-volatile memory device may be performed using a relatively low voltage. A first end of the control gate electrode 226 may be positioned over the first impurity region 206, because the control gate electrode 226 may have a shape for covering the floating gate electrode 214.

Figure 13:
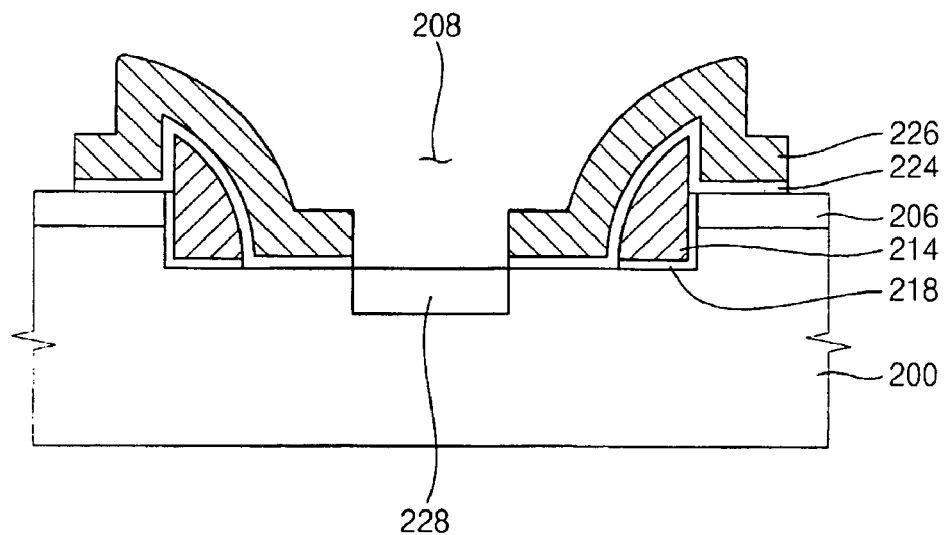

Referring to FIG. 13, the second impurity region 228 may be formed under the second horizontal face exposed through the control gate electrode 226. The second impurity region 228 may be formed using a process substantially the same as that for forming the first preliminary impurity region 202. For example, impurities may be implanted into the bottom face of the trench 208 using the control gate electrode 226 as an ion implantation mask to form the second impurity region 228. The impurities may include N type impurities, e.g., phosphorous (P) and/or arsenic (As).

The impurities in the second impurity region 228 may then be activated so that the second impurity region 228 may be partially overlapped with the control gate electrode 226. Although not illustrated, the first impurity region may be masked during formation of the second impurity region 228. Referring again to FIG. 1, the impurities in the first and second impurity regions 206 and 228 may be activated to form deeper and larger first and second impurity regions 206 and 228. While the impurities are activated, the second impurity region 228 may partially overlap the control gate electrode 226. The second impurity region 228 may function as a drain region of the non-volatile memory device.

The channel region may be formed between the first impurity region 206 and the second impurity region 228. The channel region may be turned-on or turned-off. The turn-on or the turn-off of the channel region may be partially generated. The non-volatile memory device including the semiconductor substrate 200 having the trench 208, the tunnel insulation layer pattern 218, the floating gate electrode 214, the dielectric layer pattern 224, the control gate electrode 226 covering the upper tip of the floating gate electrode 214, the first impurity region 206 and the second impurity region 228 may be completed. The non-volatile memory device in accordance with example embodiments may have a relatively small memory cell so that the non-volatile memory device may have an improved integration degree. The erasing operation of the non-volatile memory device may be carried out using a relatively low voltage.

Figure 14:
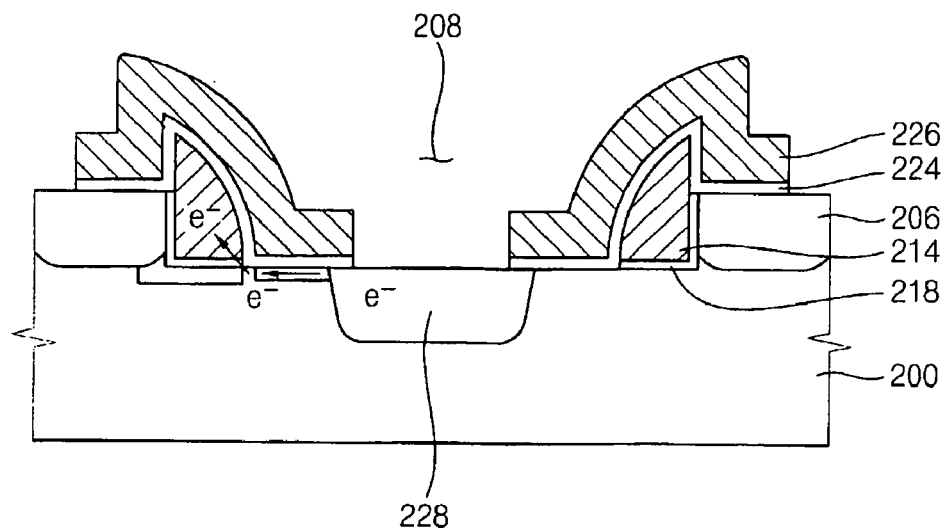

Hereinafter, the programming operation, the erasing operation and the reading operation of the non-volatile memory device are illustrated in detail. FIG. 14 is a cross-sectional view illustrating a programming operation of the non-volatile memory device in FIG. 2. Referring to FIG. 14, a threshold voltage may be applied to the control gate electrode 226 of the non-volatile memory device in FIG. 2. A positive voltage may be applied to the first impurity region 206 and the second impurity region 228 may be grounded. When the voltages are applied, the channel region between the first impurity region 206 and the second impurity region 228 may be in the "ON" state. Electrons move into the floating gate electrode 214 through the channel region having the "ON" state to perform the programming operation. Because the electrons pass through the lower tip of the floating gate electrode 214, the programming operation may be carried out using a relatively low voltage.

Figure 15:
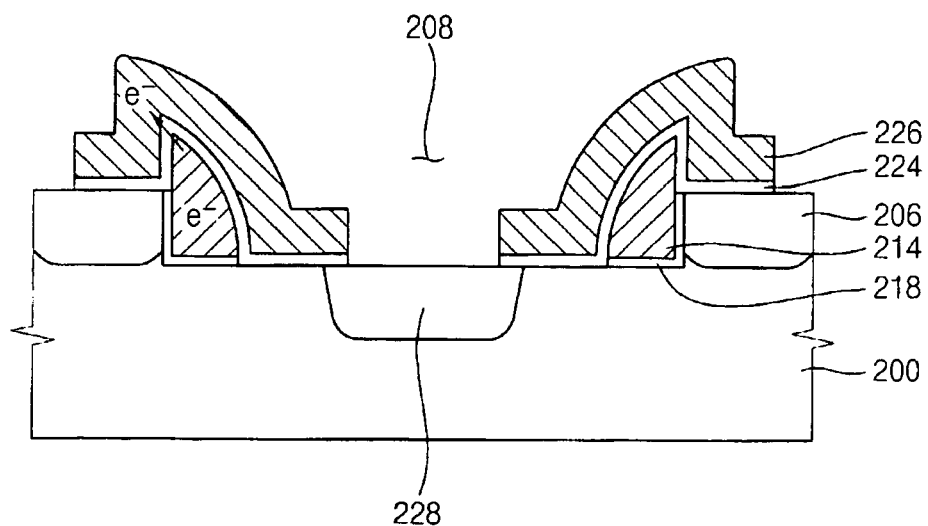

FIG. 15 is a cross-sectional view illustrating an erasing operation of the non-volatile memory device in FIG. 2. Referring to FIG. 15, a positive voltage may be applied to the control gate electrode 226 of the non-volatile memory device in FIG. 2. The first impurity region 206 and the second impurity region 228 may be grounded. When the voltage is applied, the electrons in the floating gate electrode 214 may move into the control gate electrode 226 through the channel region and may be then discharged through the control gate electrode 226 to perform the erasing operation. Because the electrons pass through the upper tip of the floating gate electrode 214, the erasing operation may be carried out using a relatively low voltage.

In the erasing operation, an over-erase may be generated due to an excessive erasing operation. Specifically, when the erasing operation is continuously carried out after the electrons in the floating gate electrode 214 are entirely discharged, holes remain in the floating gate electrode 214. The floating gate electrode 214 may be charged with a positive polarity due to the holes. When the reading operation is performed with respect to the positive floating gate electrode 214, an undesired current, e.g., a dark current, may flow due to the electrons tunneling from the second impurity region 228, thereby causing a malfunction of the reading operation.

The over-erase may cause the dark current to flow so that reliability of the non-volatile memory device may be deteriorated. Example embodiments may prevent or reduce the undesired current from flowing Into the non-volatile. memory device. Hereinafter, detailed descriptions of methods to prevent or reduce the undesired current from flowing into the non-volatile memory device will be illustrated.

Figure 16:
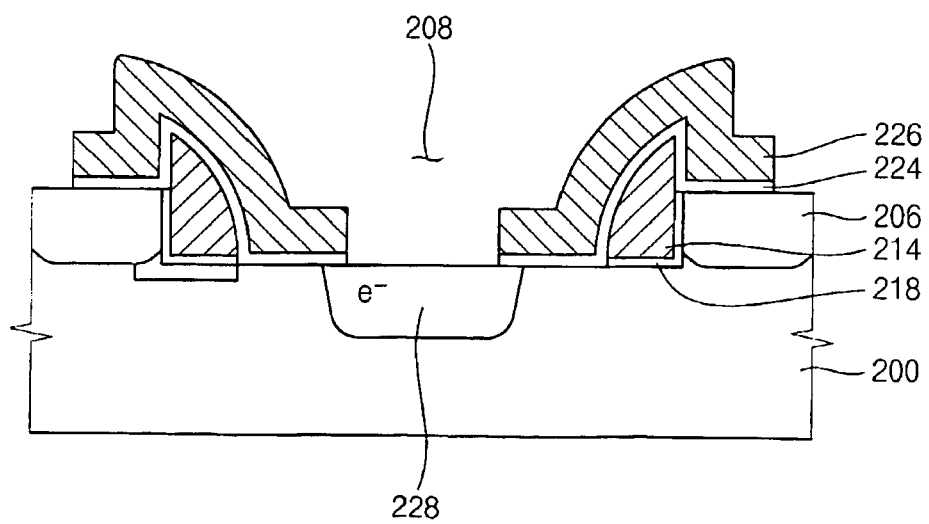

FIG. 16 is a cross-sectional view illustrating a reading operation of the non-volatile memory device in FIG. 2. Referring to FIG. 16, a threshold voltage may be applied to the control gate electrode 226 of the non-volatile memory device in FIG. 2. The first impurity region 206 and the second impurity region 228 may be grounded. The reading operation may be carried out by applying the voltages. When the reading operation is performed, the channel region under the floating gate electrode 214 may be in the "ON" state, whereas the channel region under the control gate electrode 226 may be in the "OFF" state.

Therefore, when the floating gate electrode 214 is charged with the positive polarity due to the excessive over-erase, the channel region under the control gate electrode 226 may be maintained in the "OFF" state during the reading operation of the non-volatile memory device so that the undesired current may not flow through the channel region. The reading operation of the non-volatile memory device may be normally carried out so that the non-volatile memory device may have improved reliability. According to example embodiments, the non-volatile memory device may be formed in the trench so that the non-volatile memory device may be smaller.

The upper tip of the floating gate electrode may be covered with the control gate electrode so that the erasing operation of the non-volatile memory device may be carried out using a relatively low voltage. The programming operation, the erasing operation and the reading operation of the non-volatile memory device may be improved.

Having described example embodiments, it is noted that modifications and variations can be made by persons skilled in the art in light of the above teachings. It is therefore to be understood that changes may be made in the example embodiments disclosed which is within the scope and the spirit of the appended claims.

What is claimed is:

1. A non-volatile memory device, comprising:
    a substrate having a stepped portion that includes a first horizontal face, a second horizontal face lower than the first horizontal face, and a vertical face connected between the first and second horizontal faces;
    a first impurity region under the first horizontal face;
    a floating gate electrode on the vertical face and the second horizontal face, the floating gate electrode having a tip that is higher than the first horizontal face;
    a tunnel insulation layer between the stepped portion and the floating gate electrode;
    a control gate electrode covering the floating gate electrode;
    a dielectric layer between the floating gate electrode and the control gate electrode; and
    a second impurity region under the second horizontal face and horizontally spaced apart from the floating gate electrode.

2. The non-volatile memory device of claim 1, wherein the control gate electrode is partially overlapped with the second impurity region.

3. The non-volatile memory device of claim 1, wherein the dielectric layer includes silicon oxide or silicon oxynitride.

4. The non-volatile memory device of claim 1, wherein the floating gate electrode has a sectored cross-section.

5. A method of manufacturing a non-volatile memory device, comprising:
    preparing a substrate that has a stepped portion, the stepped portion including a first horizontal face, a second horizontal face lower than the first horizontal face, and a vertical face connected between the first and second horizontal faces;
    forming a first impurity region under the first horizontal face;
    forming a tunnel insulation layer on the vertical face and the second horizontal face;
    forming a floating gate electrode on the tunnel insulation layer, the floating gate electrode having a tip that is higher than the first horizontal face;
    forming a dielectric layer on the floating gate electrode;
    covering the floating gate electrode with a control gate electrode; and
    forming a second impurity region under the second horizontal face, the second impurity region horizontally being spaced apart from the floating gate electrode.

6. The method of claim 5, wherein forming the stepped portion includes:
    forming a mask pattern on the substrate to partially expose the substrate through the mask; and
    etching the substrate using the mask pattern as an etching mask to form the trench.

7. The method of claim 6, prior to forming the mask pattern, further comprising:
    forming a first preliminary impurity region in the substrate, wherein the substrate is etched to simultaneously form the trench and the first impurity region.

8. The method of claim 6, wherein the mask pattern includes nitride, further comprising:
    forming an oxide layer on the substrate to reduce stresses between the substrate and the mask pattern.

9. The method of claim 6, wherein forming the floating gate electrode includes:
    forming a conductive layer on the mask pattern and inner faces of the trench;
    anisotropically etching the conductive layer to form the floating gate electrode; and
    removing the mask pattern.

10. The method of claim 9, further comprising:
    forming a thermal oxide layer on the mask pattern and the inner faces of the trench.

11. The method of claim 5, wherein forming the second impurity region includes:
    doping a bottom face of the trench, which is exposed through the control gate electrode, with impurities; and
    activating the impurities to be diffused into a portion of the substrate under the control gate electrode.

* * * * *